(12) United States Patent
Sugiura

(10) Patent No.: US 7,221,232 B2
(45) Date of Patent: May 22, 2007

(54) PARALLEL ARRANGEMENT FOR SAW OSCILLATOR COMPONENTS

(75) Inventor: Tsuyoshi Sugiura, Yokohama (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/916,373

(22) Filed: Aug. 11, 2004

(65) Prior Publication Data

US 2005/0077974 A1    Apr. 14, 2005

(30) Foreign Application Priority Data

Aug. 12, 2003    (JP)    ............................. 2003-292547

(51) Int. Cl.
*H03B 5/32*    (2006.01)
(52) U.S. Cl. ................. 331/107 A; 331/116 R
(58) Field of Classification Search ............. 331/107 A
See application file for complete search history.

(56) References Cited

U.S. PATENT DOCUMENTS 5,029,267 A    7/1991    Masuda et al. ......... 331/107 A
5,539,358 A *  7/1996    Hedberg ................. 331/107 A
6,051,889 A *  4/2000    Shimura .................... 257/778
6,232,846 B1 * 5/2001    Hirano et al. ........... 331/107 A
6,674,334 B1 * 1/2004    Takada et al. .......... 331/107 A

FOREIGN PATENT DOCUMENTS

JP    05-70015    9/1993
JP    2597382    4/1999

* cited by examiner

*Primary Examiner*—Joseph Chang
(74) *Attorney, Agent, or Firm*—Harness, Dickey & Pierce, P.L.C.

(57) ABSTRACT

A SAW oscillator is provided that can prevent an increased parasitic capacitance or an increased parasitic inductance even in the high frequency range. The SAW oscillator includes a semiconductor integrated circuit, a SAW device, and a passive component within a package. The semiconductor integrated circuit, the passive component, and the SAW device are disposed adjacent to an in parallel with each other along a straight line.

9 Claims, 6 Drawing Sheets

PARALLEL ARRANGEMENT FOR SAW OSCILLATOR COMPONENTS

RELATED APPLICATIONS

This application claims priority to Japanese Patent Application No. 2003-292547 filed Aug. 12, 2003 which is hereby expressly incorporated by reference herein in its entirety.

BACKGROUND

1. Technical Field of the Invention

The present invention relates to SAW oscillators, and more particularly, to a SAW oscillator including at least a semiconductor integrated circuit, a SAW device, and a passive component in a package.

2. Background Art

Due to the recent progress in semiconductor technologies, an oscillator including an oscillation circuit within a package is becoming smaller and highly integrated.

There is a demand for oscillators with higher oscillation frequencies and measures against high loads.

However, when wiring or a wiring pattern forming an oscillation loop becomes longer, the parasitic capacitance (stray capacitance) or the parasitic inductance in the high frequency range (for example, 100 MHz or higher) becomes increased. If the parasitic capacitance is increased in the oscillation loop, the dielectric loss becomes larger and the load impedance is increased in the high frequency range. Accordingly, the gain is decreased, and as a result, a desired oscillation frequency cannot be obtained or oscillation itself cannot be obtained in the oscillation circuit.

If the parasitic inductance is increased (added) in the oscillation loop, the load impedance is increased in the high frequency range. Accordingly, the gain is decreased, and as a result, a desired oscillation frequency cannot be obtained or oscillation itself cannot be obtained in the oscillation circuit.

In view of this background, Japanese Utility Model Registration Application Publication No. 5-70015 discloses that the length of wiring in the oscillation loop, and in particular the output side wiring, may be decreased. The oscillator disclosed in Japanese Utility Model Registration Application Publication No. 5-70015 uses a quartz resonator, and a semiconductor integrated circuit (IC) connected to the quartz resonator is disposed toward the output side so that the length of the wiring for the semiconductor integrated circuit at the output side is decreased.

In the invention disclosed in Japanese Utility Model Registration Application Publication No. 5-70015, the parasitic inductance or the load impedance occurring at the output side wiring can be prevented. However, the total length of the wiring or wiring pattern is not changed in the entire oscillation loop. Accordingly, increased load impedance cannot be prevented in the entire oscillation loop.

Accordingly, to solve the above-described problem, it is an object of the present invention to provide a SAW oscillator that can prevent an increased parasitic capacitance or an increased parasitic inductance even in the high frequency range by minimizing the length of the wiring or wiring pattern in the entire oscillation loop.

SUMMARY

In order to solve the above-described problem, the SAW oscillator of the present invention is characterized in that a semiconductor integrated circuit, a SAW device, and a passive component forming an oscillation loop are disposed adjacent to and in parallel with each other along a straight line.

With this configuration, the wiring or a wiring pattern for electrically connecting the semiconductor integrated circuit, the SAW device, and the passive component forming the oscillation loop can be reduced to a required minimal length (minimum length). Accordingly, even when the oscillation frequency is in the high frequency range, good oscillation can be maintained.

In the above-configured SAW oscillator, the semiconductor integrated circuit, the SAW device, and the passive component are electrically connected to each other via wiring patterns disposed in a package, thereby allowing flip-chip mounting of the semiconductor integrated circuit and the SAW device.

In the above-configured SAW oscillator, the terminal of the passive component may be electrically connected to a wiring pattern disposed in the package by a conductive adhesive or solder. The semiconductor integrated circuit and the SAW device may be electrically connected to wiring patterns disposed in the package via wires. With this arrangement, means for electrically connecting the above-described elements can be selected.

The terminal of the passive component may be electrically connected to a wiring pattern disposed in the package by a conductive adhesive or solder. The terminals of the semiconductor integrated circuit and the SAW device may be electrically connected to wiring patterns disposed in the package by flip-chip mounting. Accordingly, electrical connection for the above-described elements can be stabilized.

The passive component may be connected in series to or in parallel with the SAW device.

DETAILED DESCRIPTION

Figure 1:
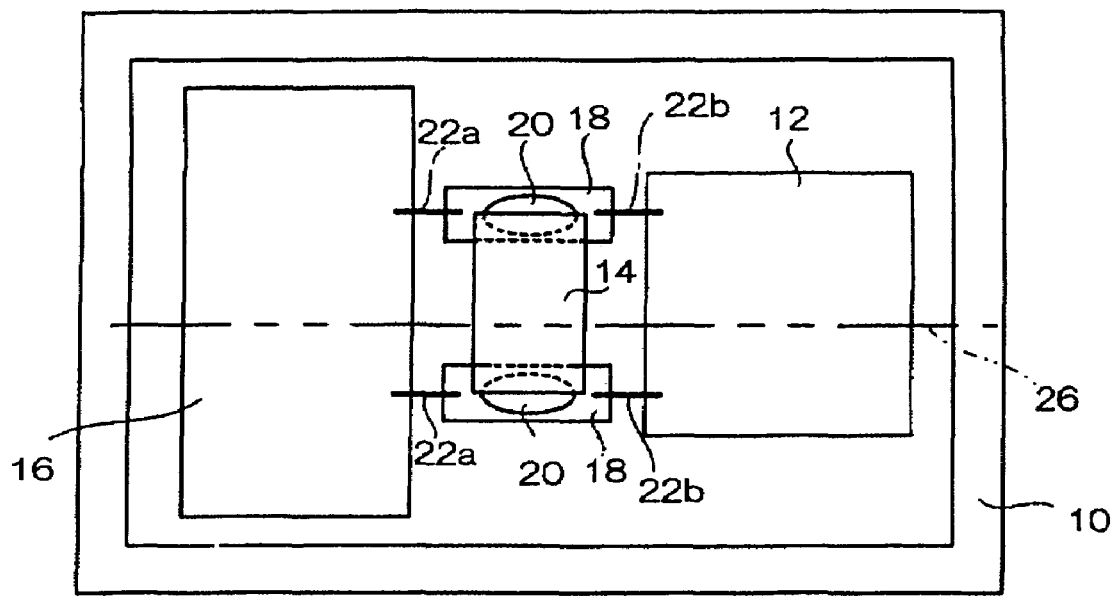
FIG. 1 illustrates the main portions of a first embodiment of a SAW oscillator of the present invention.

Embodiments of a SAW oscillator of the present invention are described below with reference to the drawings. FIG. 1 illustrates the main portions of a first embodiment of a SAW oscillator of the present invention.

The basic configuration of this embodiment includes a package 10, which is a substrate for allowing the elements forming an oscillation loop to be mounted therein, a semiconductor integrated circuit (IC) 12, a SAW device (SAW resonator 16), a passive component 14 interposed between the IC 12 and the SAW resonator 16, and wires 22a and 22b for electrically connecting the above-described elements, all of which are mounted within the package 10.

The configuration of the package 10 is such that it can accommodate the above-described devices mounted therein. Generally, the package 10 is an oblong box type, in particular, a rectangular box type, can be used. The material of the package 10 is, for example, a ceramic or metal, and pattern electrodes (not shown) are formed in the package 10 if necessary.

The IC 12 is an integrated circuit formed of a semiconductor material, such as silicon, and having an amplification function. The passive component 14 is, for example, an inductor or a capacitor.

The IC 12, the SAW resonator 16, and the passive component 14 are disposed adjacent to and in parallel with each other within the package 10 such that they are aligned along on a straight line 26. In this case, it is only necessary that the devices be aligned in an area containing the straight line 26, and the center lines of the devices do not have to coincide with one another or with the straight line 26. It is desirable that the straight line 26 be parallel with the sidewalls of the package 10. In this case, the straight line 26 may be parallel with the short sidewalls or the long sidewalls of the package 10.

Various arrangements of the IC 12, the SAW resonator 16, and the passive component 14 can be considered. In this embodiment, the IC 12 is disposed toward the right of the package 10, as shown in FIG. 1. In this case, the active surface of the IC 12 faces upward, and the non-active surface of the IC 12 faces downward, and thus, the non-active surface is bonded to the bottom of the package 10 with, for example, adhesive. The passive component 14 is located at the central portion of the package 10 and on the left side of the IC 12. The passive component 14 is mounted on the bottom of the package 10 with a conductive adhesive 20 or solder. Accordingly, it is desirable that pattern electrodes 18 be disposed on the bottom of the package 10. The SAW resonator 16 is located within the package 10. The SAW resonator 16 is disposed toward the left of the package 10 and adjacent to the pattern electrodes 18 (on the left side of the passive component 14). The active surface of the SAW resonator 16 faces upward, and thus, the non-active surface facing downward can be bonded to the bottom of the package 10 with, for example, adhesive, as in the IC 12.

The electrodes of the IC 12, the SAW resonator 16, and the passive component 14, which are fixed in the package 10, are electrically connected to each other by wires 22 (22a and 22b). More specifically, the SAW resonator 16 and the electrode patterns 18 are connected by wire bonding using the wire 22a, while the electrode patterns 18 and the IC 12 are connected by wire bonding using the wires 22b.

In this embodiment, the IC 12, the SAW resonator 16, and the passive component 14 are arranged so that the wires 22a and 22b for electrically connecting the above-described devices become parallel with the above-described straight line 26. Accordingly, the wires 22a and 22b can be reduced to a required minimum length for connection.

Also in this embodiment, the IC 12, the SAW resonator 16, and the passive component 14 are connected in parallel with each other.

The circuit formed of the IC 12, the SAW resonator 16, and the passive component 14 is referred to as an "oscillation loop".

By minimizing the length of the wiring in the oscillation loop, phenomena, such as abnormal oscillation or oscillation disability, caused by an increased parasitic capacitance or an increased parasitic inductance in the high frequency range, can be prevented.

Figure 2:
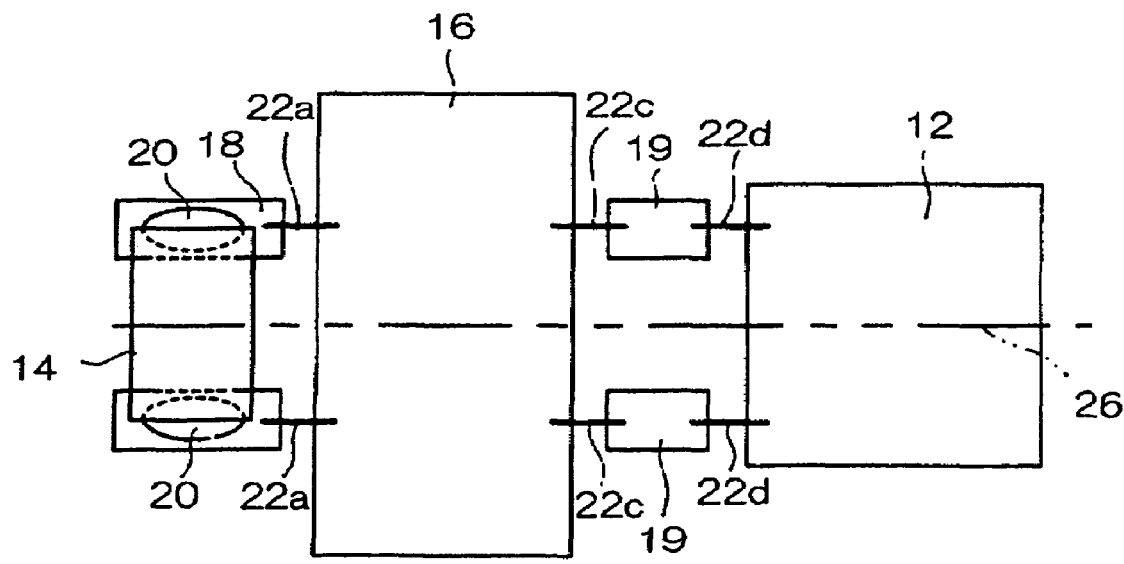
FIG. 2 illustrates the main portions of a second embodiment of a SAW oscillator of the present invention.

A second embodiment of the SAW oscillator of the present invention is described below. The basic configuration of this embodiment shown in FIG. 2 is substantially similar to that of the first embodiment. The second embodiment differs from the first embodiment only in the arrangement of the IC 12, the SAW resonator 16, and the passive component 14 to be mounted within a package (not shown). Accordingly, in FIG. 2, the same elements as those of the first embodiment are designated with like reference numerals, and an explanation thereof is thus omitted.

In this embodiment, the IC 12, the SAW resonator 16, and the passive component 14 are arranged adjacent to each other along the straight line 26 in the order of the IC 12, the SAW resonator 16, and the passive component 14 from the right of FIG. 2. In this case, the IC 12, the SAW resonator 16, and the passive component 14 are arranged parallel to each other. In FIG. 2, when electrically connecting the IC 12 and the SAW resonator 16, pattern electrodes 19 are disposed at the bottom of the package 10, and the IC 12 and the SAW resonator 16 are connected via the pattern electrodes 19 by wire bonding using wires 22c and 22d. However, the IC 12 and the SAW resonator 16 may be directly connected by wire bonding.

Also in this embodiment, the IC 12, the SAW resonator 16, and the passive component 14 are electrically connected to each other by wires 22. In this case, the wires 22 are arranged so that they are parallel to the straight line 26, thereby reducing the wiring in the oscillation loop to a required minimal length (minimum length).

Accordingly, phenomena, such as abnormal oscillation or oscillation disability, caused by an increased parasitic capacitance or an increased parasitic inductance in the high frequency range, can be prevented.

Figure 3:
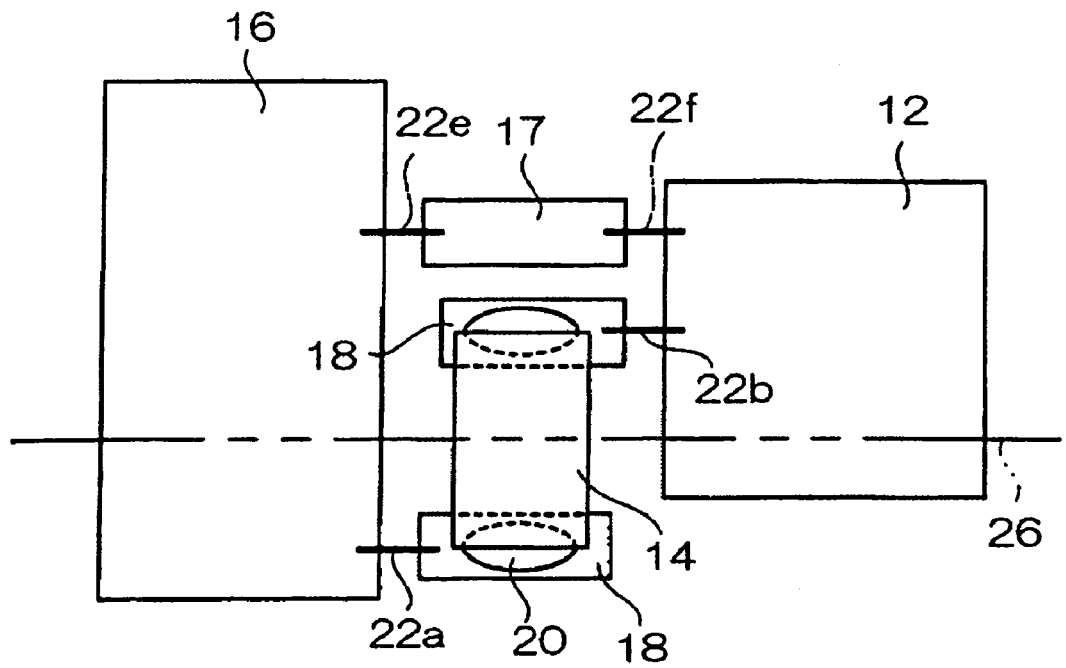
FIG. 3 illustrates the main portions of a third embodiment of a SAW oscillator of the present invention.

A third embodiment of the SAW resonator of the present invention is described below. The basic configuration of this embodiment shown in FIG. 3 is substantially similar to that of the first or second embodiment. The third embodiment differs from the first and second embodiments in that the IC 12, the SAW resonator 16, and the passive component 14 are connected in series with each other.

In this embodiment, a line for electrically connecting the IC 12 and the SAW resonator 16 via the passive component 14 and a line for directly electrically connecting the IC 12 and the SAW resonator 16 are required. In FIG. 3, a pattern electrode 17 is disposed in the line for directly connecting the IC 12 and the SAW resonator 16, and the IC 12 and the SAW resonator 16 can be connected to each other via the pattern electrode 17 by wire bonding using wires 22e and 22f. In this case, the IC 12 and the SAW resonator 16 may be directly connected to each other by wire bonding, in which case, the wire 22 should be arranged in parallel with the straight line 26.

With this configuration, as in the case of the series-connected oscillation loop, the wiring in the loop can be reduced to a required minimal length (minimum length).

Accordingly, phenomena, such as abnormal oscillation or oscillation disability, caused by an increased parasitic capacitance or an increased parasitic inductance in the high frequency range, can be prevented.

Figure 4:
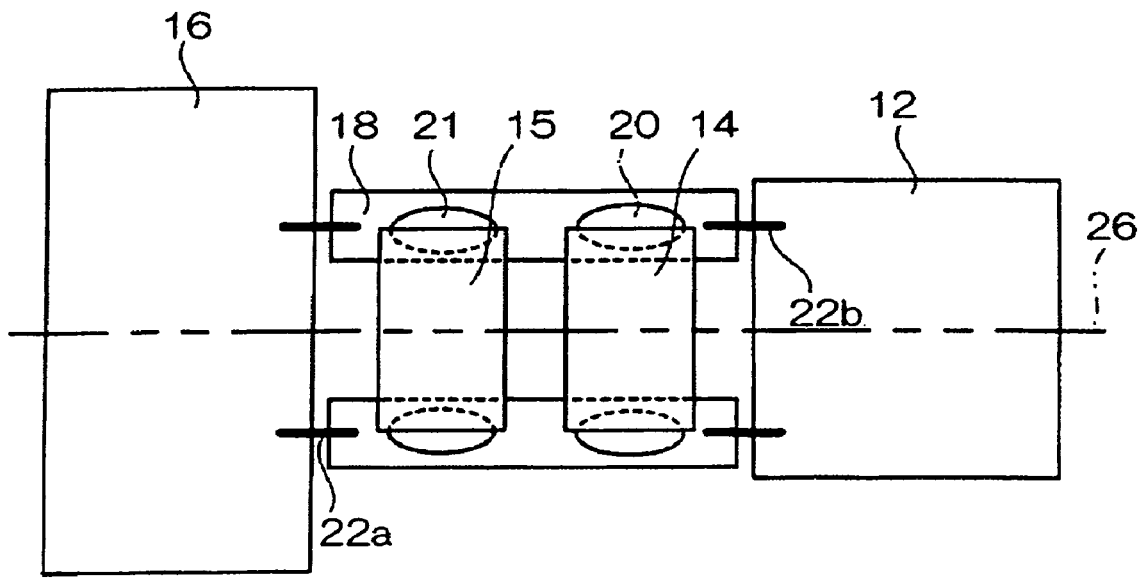
FIG. 4 illustrates the main portions of a fourth embodiment of a SAW oscillator of the present invention.

A fourth embodiment of the SAW oscillator of the present invention is described below. The basic configuration of this embodiment shown in FIG. 4 is substantially similar to that of the first, second, or third embodiment. The fourth embodiment differs from the first, second, and third embodiments in that two passive components are provided. Accordingly, in FIG. 4, the same elements as those of the first, second, and third embodiments are designated with like reference numerals, and an explanation thereof is thus omitted.

The arrangement of the IC 12, the SAW resonator 16, and the passive component 14 is substantially similar to that of the first embodiment. This embodiment is characterized in that two passive components such as an inductor and a capacitor (passive components 14 and 15) are provided. The passive components 14 and 15 are mounted side by side on the electrode patterns 18 disposed at the bottom of a package (not shown). For mounting the passive components 14 and 15, conductive adhesive 20 and 21 or solder can be used, as in the first embodiment.

The other features of the configuration and operation are similar to those of the first embodiment, and a detailed explanation thereof is thus omitted.

Figure 5:
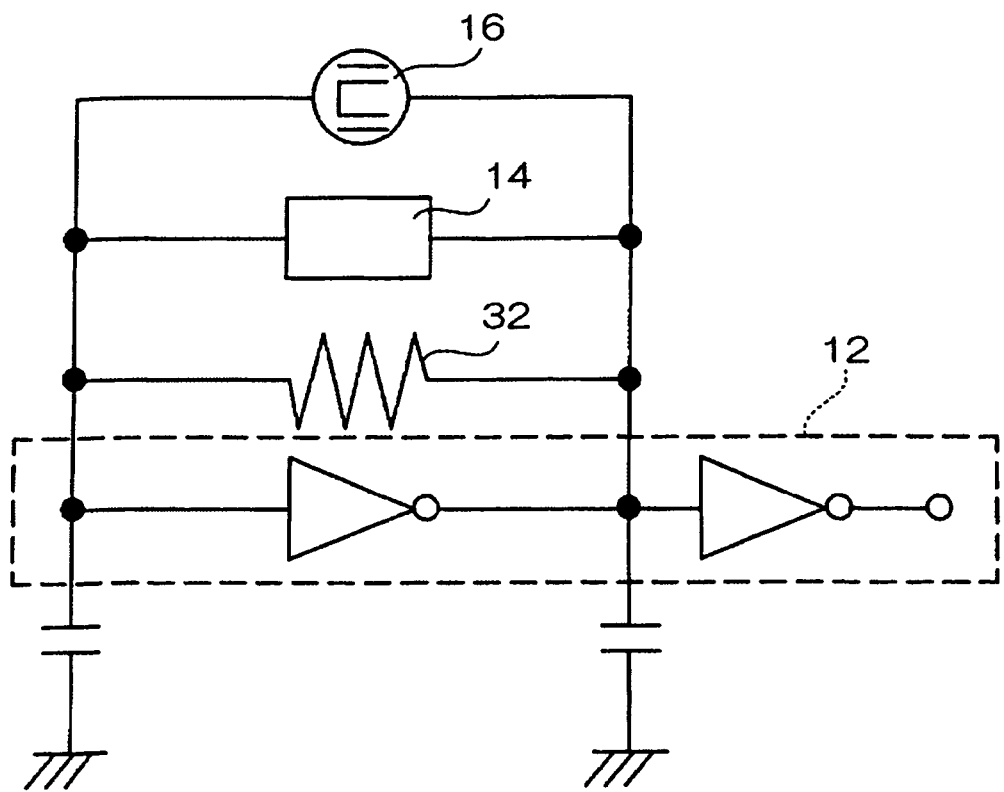
FIG. 5 is a circuit diagram of the first, second, and fourth embodiments of the present invention.
Figure 6:
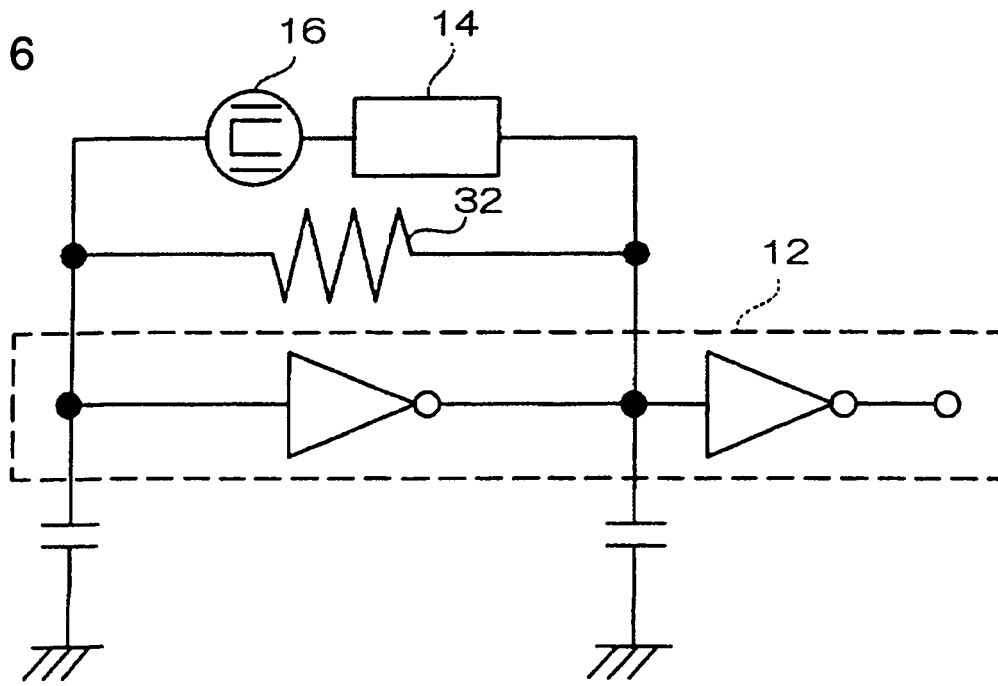
FIG. 6 is a circuit diagram of the third embodiment of the present invention.
Figure 7:
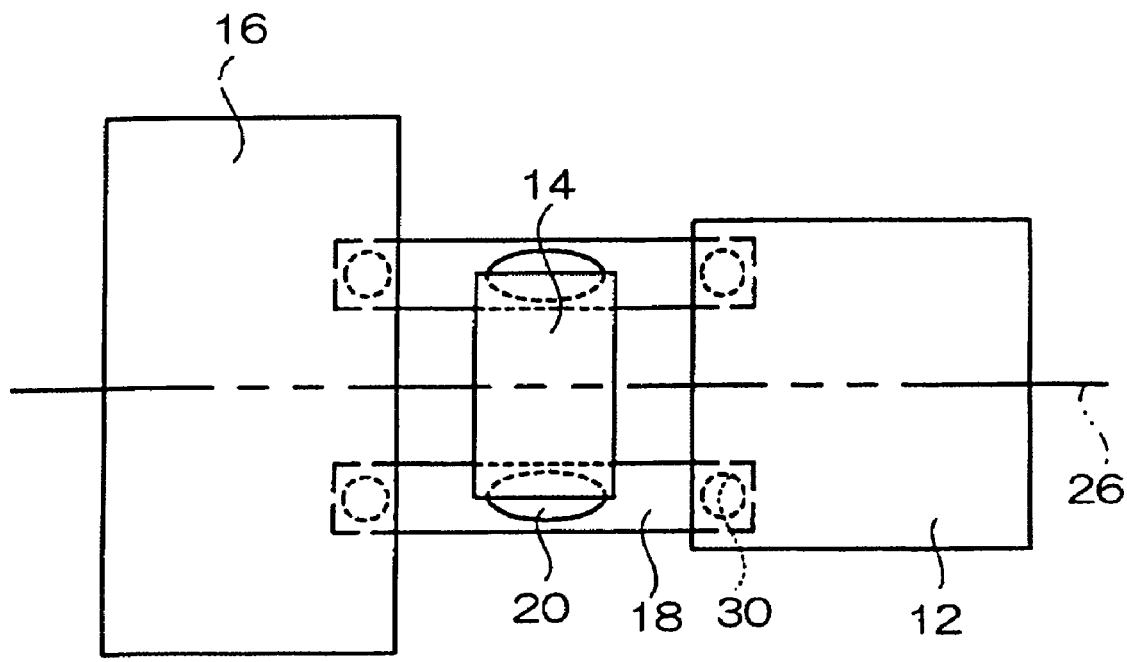
FIG. 7 is a modified example of the first embodiment of the SAW resonator of the present invention.
Figure 8:
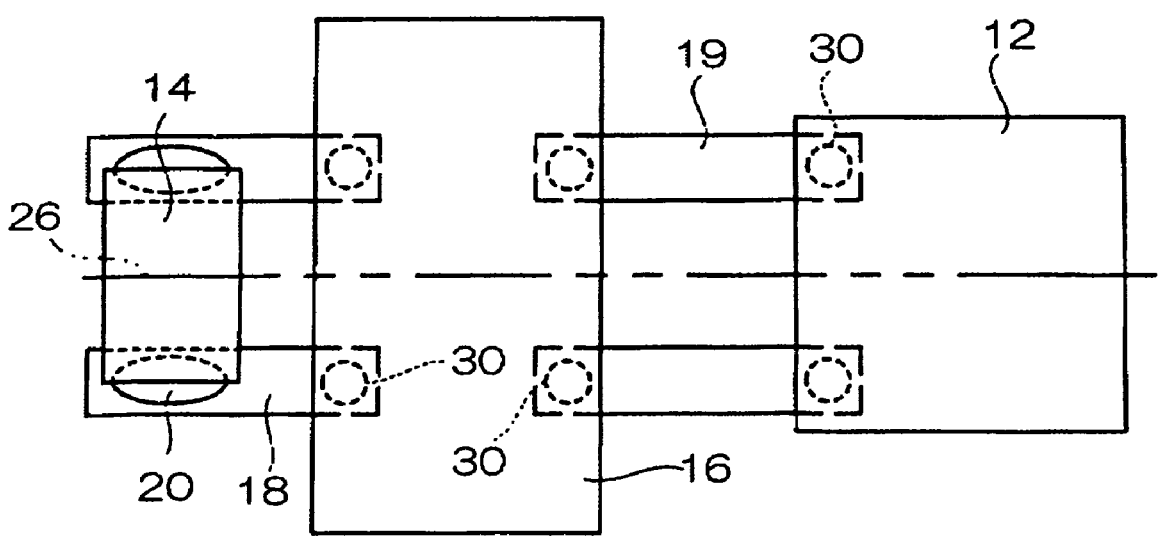
FIG. 8 is a modified example of the second embodiment of the SAW resonator of the present invention.
Figure 9:
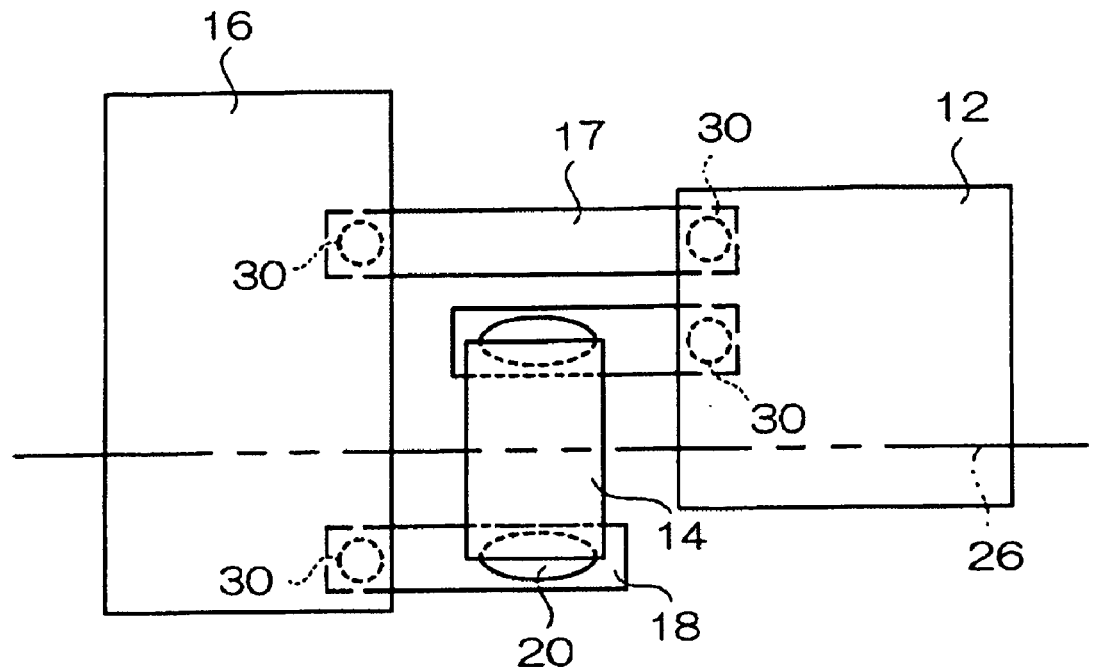
FIG. 9 is a modified example of the third embodiment of the SAW resonator of the present invention.
Figure 10:
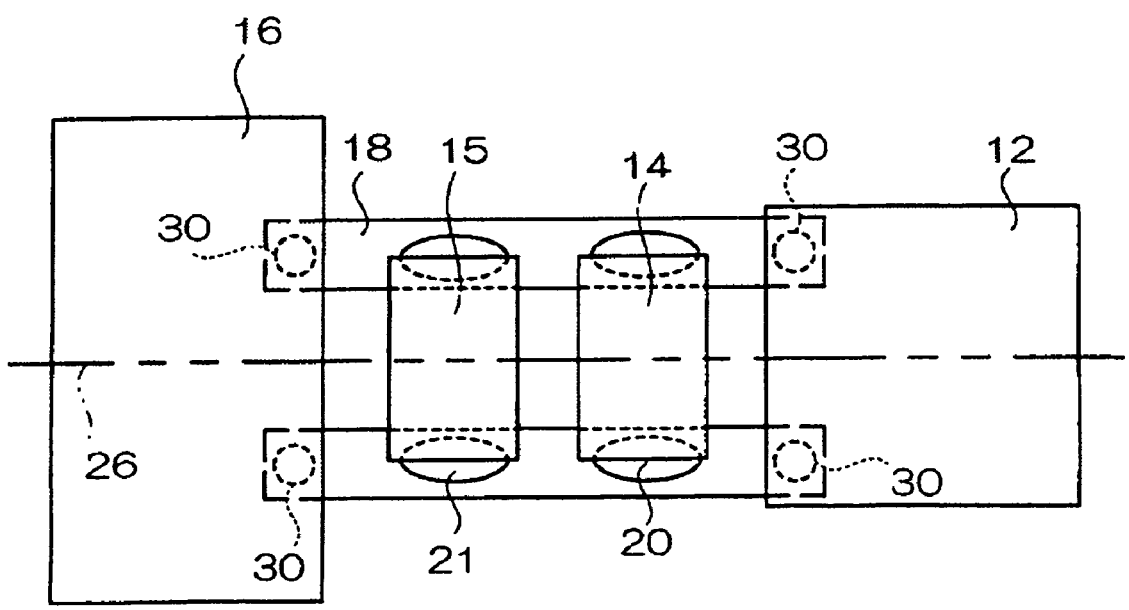
FIG. 10 is a modified example of the fourth embodiment of the SAW resonator of the present invention.

The circuit diagrams of the SAW oscillators according to the above-described embodiments are shown in FIGS. 5 and 6. FIG. 5 illustrates the circuit in which the IC 12, the SAW resonator 16, and the passive component 14 are connected in parallel with each other, which corresponds to the first, second, and fourth embodiment. In this circuit diagram, in addition to the passive component 14, a resistor 32 is illustrated, though the resistor 32 is not shown in FIGS. 1, 2, and 4.

FIG. 6 illustrates the circuit in which the IC 12, the SAW resonator 16, and the passive component 14 are connected in series with each other, which corresponds to the third embodiment. In this circuit diagram, as well as that in FIG. 5, the resistor 32 is illustrated, though it is not shown in FIG. 3.

Modified examples of the first through fourth embodiments are shown in FIGS. 7 through 10. FIGS. 7, 8, 9, and 10 correspond to the first, second, third, and fourth embodiments, respectively. The basic configurations of the modified examples are similar to those of the corresponding embodiments. The modified examples are different from the corresponding embodiments in that the IC 12 and the SAW resonator 16 are flip-chip mounted.

When flip-chip mounting the IC 12 and the SAW resonator 16 as in the modified examples, bumps 30 are used instead of the wires 22. The other features of the configuration and operation of the modified examples are similar to those of the corresponding embodiments.

Figure 11:
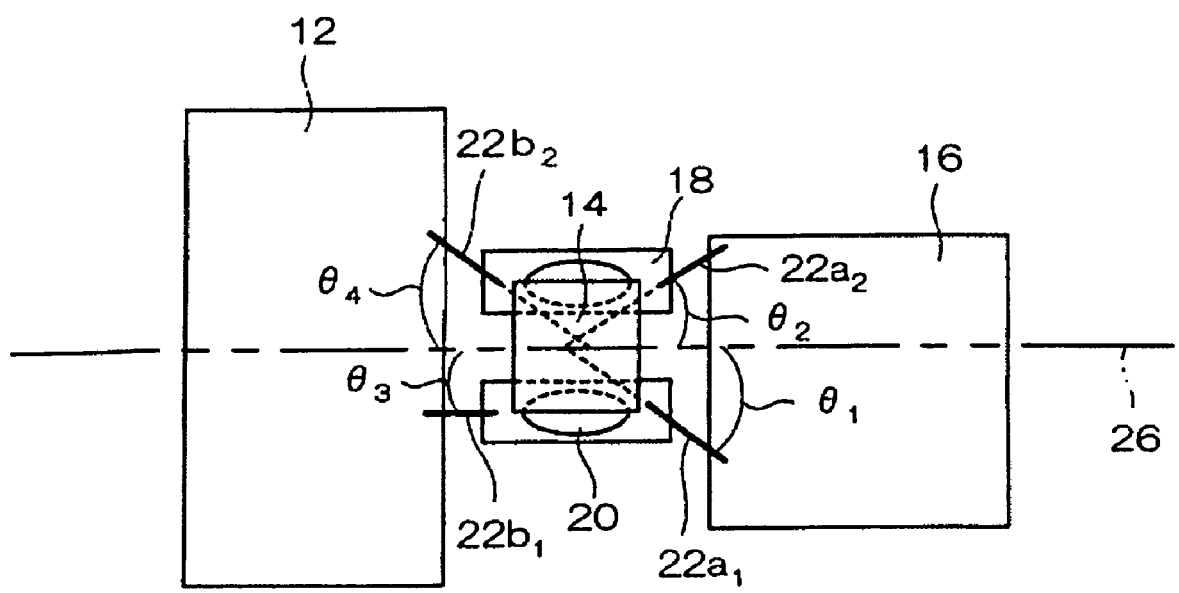
FIG. 11 illustrates another embodiment of the present invention.

FIG. 11 illustrates another embodiment. In this case, it is difficult to dispose the wires 22 parallel to the straight line 26 because of the arrangement of bonding pads (not shown) provided for the IC 12, the SAW resonator 16, and the passive component 14 or the sizes of the IC 12, the SAW resonator 16, and the passive component 14.

In this embodiment, even when the wires 22 and the straight line 26 cannot be arranged in parallel with each other in performing wire bonding due to the sizes of the IC 12, the SAW resonator 16, and the passive component 14 or the positional arrangement of bonding pads (not shown), the minimum wiring pattern in accordance with the arrangement of the wires 22 and the straight line 26 can still be ensured.

That is, wire bonding is performed so that the angles θ1, θ2, θ3, and θ4 formed by wires $22a_1$, $22a_2$, $22b_1$, and $22b_2$, respectively, with respect to the straight line 26 become 45 degrees or smaller, ideally approximating 0 degrees. With this arrangement, even if the bonding pads provided for the IC 12, the SAW resonator 16, and the passive component 14 are displaced from each other, wiring can be laid with a minimum distance in accordance with a displacement of the IC 12, the SAW resonator 16, and the passive component 14. Accordingly, the wiring in the loop can be reduced to a required minimal length (minimum length).

Thus, phenomena, such as abnormal oscillation or oscillation disability, caused by an increased parasitic capacitance or an increased parasitic inductance in the high frequency range, can be prevented.

In the above-described SAW oscillator, a semiconductor integrated circuit, a SAW device, and a passive component forming an oscillation loop are disposed adjacent to and in parallel with each other along a straight line. With this configuration, wiring or a wiring pattern for electrically connecting the semiconductor integrated circuit, the SAW device, and the passive component forming the oscillation loop can be reduced to a required minimal length (minimum length). Accordingly, even when the oscillation frequency is in the high frequency range, good oscillation can be maintained.

In the above-configured SAW oscillator, the semiconductor integrated circuit, the SAW device, and the passive component are electrically connected to each other via wiring patterns disposed in a package, thereby allowing flip-chip mounting of the semiconductor integrated circuit and the SAW device.

In the above-configured SAW oscillator, the terminal of the passive component may be electrically connected to a wiring pattern disposed in the package by a conductive adhesive or solder. The semiconductor integrated circuit and the SAW device may be electrically connected to wiring patterns disposed in the package via wires. With this arrangement, means for electrically connecting the above-described elements can be selected.

The terminal of the passive component may be electrically connected to a wiring pattern disposed in the package by a conductive adhesive or solder. The terminals of the semiconductor integrated circuit and the SAW device may be electrically connected to wiring patterns disposed in the package by flip-chip mounting. Accordingly, electrical connection for the above-described elements can be stabilized.

The above-described straight line 26 is specified to be parallel with the sidewalls of the package 10. With this arrangement, the devices can be efficiently accommodated within the package 10, and also, the wiring or the wiring pattern can be minimized.

What is claimed is:

1. A SAW oscillator comprising:
   a semiconductor integrated circuit, a SAW device, and a passive component forming an oscillation loop; and
   wherein each of the semiconductor integrated circuit, the SAW device, and the passive component are electrically connected to each other to form the oscillation loop and disposed adjacent to and parallel with each other along a straight line, and wherein electrical connections of the semiconductor integrated circuit, the SAW device, and the passive component are parallel to the straight line, and wherein one of the integrated circuit, the SAW device, and the passive component is located between the others of the integrated circuit, the SAW device, and the passive component.

2. The SAW oscillator according to claim 1, wherein the semiconductor integrated circuit, the SAW device, and the passive component are electrically connected to each other via wiring patterns disposed in a package.

3. The SAW oscillator according to claim 1, wherein a terminal of the passive component is electrically connected to a wiring pattern disposed in a package by at least one of a conductive adhesive and solder, and the semiconductor integrated circuit and the SAW device are electrically connected to wiring patterns disposed in the package by wires.

4. The SAW oscillator according to claim 1, wherein a terminal of the passive component is electrically connected to a wiring pattern disposed in a package by at least one of a conductive adhesive and solder, and terminals of the semiconductor integrated circuit and the SAW device are electrically connected to wiring patterns disposed in the package by flip-chip mounting.

5. A SAW oscillator comprising:
an oscillation loop including a semiconductor integrated circuit, a SAW device, and a passive component; and
wherein each of the semiconductor integrated circuit, the SAW device, and the passive component are electrically connected to each other in the oscillation loop and disposed adjacent to and parallel with each other along a straight line, and wherein electrical connections of the semiconductor integrated circuit, the SAW device, and the passive component are parallel to the straight line, and wherein one of the integrated circuit, the SAW device, and the passive component is located between the others of the integrated circuit, the SAW device, and the passive component.

6. The SAW oscillator according to claim 5, further comprising:
a package having wiring patterns disposed therein; and
wherein the semiconductor integrated circuit, the SAW device, and the passive component are electrically connected to each other via the wring patterns.

7. The SAW oscillator according to claim 5, further comprising:
a package including wiring patterns disposed therein; and
wherein a terminal of the passive component is electrically connected to the wiring patterns by at least one of a conductive adhesive and solder; and
the semiconductor integrated circuit and the SAW device are electrically connected to the wiring patterns by wires.

8. The SAW oscillator according to claim 5, further comprising:
a package having wiring patterns disposed therein; and
wherein a terminal of the passive component is electrically connected to the wiring patterns by at least one of a conductive adhesive and solder; and terminals of the semiconductor integrated circuit and the SAW device are electrically connected to the wiring patterns by flip-chip mounting.

9. A SAW oscillator comprising:
a semiconductor integrated circuit, a SAW resonator, and a passive component forming an oscillation loop on a package; and
wherein each of the semiconductor integrated circuit, the SAW resonator, and the passive component are electrically connected to each other in the oscillation loop and disposed adjacent to and parallel with each other along a straight line, wherein electrical connections of the semiconductor integrated circuit, the SAW resonator, and the passive component are parallel to the straight line, and wherein the passive component is formed on the package separate from the SAW resonator and is at least one of a capacitor and an inductor.

* * * * *